United States Patent [19]

Akeyama et al.

[11] 4,396,705
[45] Aug. 2, 1983

[54] PATTERN FORMING METHOD AND PATTERN FORMING APPARATUS USING EXPOSURES IN A LIQUID

[75] Inventors: Masamoto Akeyama, Kokubunji; Yoshifumi Tomita, Mobara; Saburo Nonogaki, Tokyo, all of Japan

[73] Assignee: Hitachi, Ltd., Tokyo, Japan

[21] Appl. No.: 303,400

[22] Filed: Sep. 18, 1981

[30] Foreign Application Priority Data

Sep. 19, 1980 [JP] Japan ................................ 55-129328

[51] Int. Cl.³ .......................... G03C 5/04; G03C 5/00; G03C 5/06; G03D 3/08
[52] U.S. Cl. ..................................... 430/326; 430/325; 430/327; 430/331; 430/396; 354/323; 354/333; 355/132
[58] Field of Search ............... 430/327, 396, 325, 331, 430/403, 326; 354/323, 333; 355/91, 132; 350/63

[56] References Cited

U.S. PATENT DOCUMENTS

| | | | |
|---|---|---|---|
| 3,434,835 | 3/1969 | Gaynor et al. | 430/327 |
| 3,573,975 | 4/1971 | Dhaka et al. | 430/327 |
| 3,664,738 | 5/1972 | Cameron | 355/91 |
| 3,732,120 | 3/1973 | Hummel | 430/327 |

FOREIGN PATENT DOCUMENTS 23231 2/1981 European Pat. Off. ............ 430/396

*Primary Examiner*—Richard L. Schilling
*Attorney, Agent, or Firm*—Antonelli, Terry & Wands

[57] ABSTRACT

A pattern forming method comprising a step of disposing a substrate with a coated film of photosensitive composition and a mask having a predetermined pattern in a first liquid which does not dissolve said coated film of photosensitive composition, and a step of exposing said coated film to light through said mask. An apparatus for attaining this method is also disclosed. The influence of dust can be readily avoided and an image with high resolution is obtained.

14 Claims, 3 Drawing Figures

PATTERN FORMING METHOD AND PATTERN FORMING APPARATUS USING EXPOSURES IN A LIQUID

BACKGROUND OF THE INVENTION

This invention relates to a pattern forming method and a pattern forming apparatus, and more particularly to a method for forming a pattern in liquid and an apparatus for carrying out the method.

Usually, the photolithographic method is widely used for pattern formation. For example, according to a customary used pattern forming method for an integrated circuit, a photosensitive composition is coated over a substrate such as silicon, and then exposed to an ultraviolet light or X-ray through a suitable photomask to transmute only the exposed photosensitive composition. Thereafter, a predetermined part of the substrate is subject to development to expose the part and then subjected to necessary later processes such as etching, deposition and so on. Since an object to be processed for fabricating an integrated circuit is of a minute dimension from submicron to micron, the influence of dust is considerable in whole processes. In order to attain no defect, dust removal and its control are essential requirements. The so-called photo-processes such as exposure and development makes no exception. Further, in the exposition step, the photomask which absorbs the irradiation energy suffers from thermal expansion, to cause a difficulty of control of the dimensional accuracy in the process.

SUMMARY OF THE INVENTION

An object of this invention is to provide a pattern forming method and an apparatus for carrying out the method, which facilitate the dust control and solve the problem of thermal expansion of the mask.

Another object of this invention is to provide a pattern forming method and an apparatus for carrying out the method, which attain high resolution and high accuracy.

These and a further object of this invention is attained by a pattern forming method and an apparatus for carrying out the method comprising a step of disposing a substrate with a coated film of photosensitive composition and a mask with a predetermined pattern in a first liquid which does not dissolve the above coated film, and a step of exposing the coated film to light through the above-mentioned mask.

DESCRIPTION OF THE PREFERRED EMBODIMENTS

According to this invention, besides the above-mentioned exposure in liquid, it is preferable to dispose a second liquid, which is not miscible with the first liquid and has an effect of developing the coated film of photosensitive composition, in contact with the first liquid and to carry out a step of moving the substrate with the coated film after exposure into the second liquid to develop it. However, it may be also possible that only the exposure is done in liquid, the substrate with the coated film being taken out to an air atmosphere after exposure and developed, as in the prior art method.

In this manner, at least the substrate with the coated film and the photomask parts are disposed in liquid so that exposure and dvelopment may be done therein. Therefore, the liquid not only protects the substrate with the coated film and the mask from the room dust but also actively removes the dust attached to the substrate by fluid motion. Moreover, the temperature of the liquid is kept constant. Hence, any thermal expansion of the mask is suppressed.

Since the propagation velocity of light varies in inverse proportion to the refractive index of the liquid as light progresses from air to liquid, the same effect as in the case of irradiation by a short wavelength light can be obtained for the pattern formation.

This short wavelength effect can produce a pattern with high resolution of high accuracy.

Since a certain kind of photosensitive composition, eg. cyclized rubber-bisazide system, is prevented from photopolymerization by the existence of oxygen, it is customary to substitute the air atmosphere by nitrogen before exposure. However, this invention makes execution of such an operation unnecessary.

Figure 1:
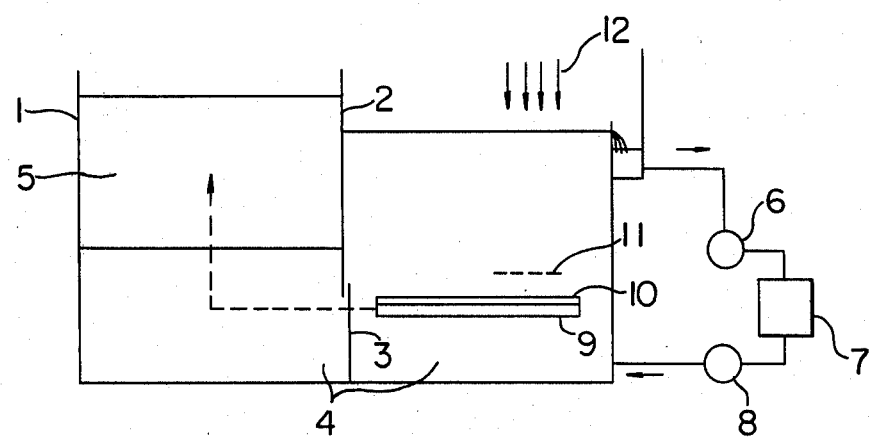
FIG. 1 is an explanatory view of an embodiment of an apparatus of this invention.

Explanation of this invention will be made hereinafter with reference to the drawings, in which FIG. 1 is an explanatory view of an embodiment of an apparatus to which the method of this invention is applied.

A vessel 1 is divided into two sections by a partition 2. The interior of the vessel is not completely separated but connected by a space part provided in a portion of the partition 2, where a shutter 3 capable of opening and shutting is placed. A first liquid 4 is introduced into the first section (right side in FIG. 1) of the vessel and also into the second section (left side in FIG. 1) of the vessel through the space part of the partition. A second liquid 5, a developer, is disposed on the first liquid in the second section of the vessel. In the present example, it is assumed that the specific gravity of the first liquid 4 is larger than that of the second liquid. The vessel is provided with a thermostat means and a filter means which keep the first liquid at a constant temperature and cleanness, respectively. Namely, the first liquid 4 is circulated by a pump 6 through a thermostat 7 and a filter 8 and kept at a constant temperature and cleanness. The second liquid, being made contact with the first liquid, is also kept at a constant temperature.

The substrate 9 with a coated film 10 of photosensitive composition, and the mask 11, are disposed in the first liquid 4. A holder of the substrate 9 is omitted in FIG. 1. Under this condition, the light 12 is irradiated onto the coated film through the mask. The shutter 3 is opened after exposure, and then the substrate 9 with the coated film 10 is moved into the second liquid 5 in the second section of the vessel, and developed. Later processes are performed in the usual way.

Here, it is preferable that the vessel be placed in a constant temperature environment. If the quantity of the first liquid is large and the irradiation time in a predetermined period is short, the liquid temperature will be kept nearly at constant without the thermostat. However, it is recommended to provide the thermostat, as mentioned before. Various kinds of publicly known means and methods may be used for the thermostat and the filter.

Although FIG. 1 shows an example where the specific gravity of the first liquid 4 is larger than that of the second liquid 5, as described above, the relation may be opposite. In the latter case, it is necessary that the space part of the partition 2 be at an upper part of the vessel. Namely, that part of the partition 2 which is in contact with the second liquid 5 should divide the interior of the vessel completely into two sections.

Although the shutter 3 is not always necessary, the provision of it can prevent the second liquid to enter the first section through vibration, etc.

Practically, the mask is pressure-mounted onto the substrate through a spacer (not shown) so that the liquid may easily enter the gap between the coated film and the mask. For this purpose, a substrate holding means such as employed for exposure in air may be used, if necessary. As another method, the mask may be pressure-mounted onto the substrate in the liquid. Before the substrate is moved into the second liquid, the mask is separated from the substrate. Thereafter, only the substrate with the coated film is moved.

Necessary conditions as the first and second liquids are such that they are not miscible with each other, as described before, and that they give no harmful influence for the coated film, the substrate and the mask. Table 1 shows an example of such liquids and their refractive indexes at from 15° C. to 20° C. The table shows very usual solvents. It is needless to say that various other solvents may be used. Further, mixtures of these solvents, or solutions which are dissolving various substances, may be also applicable. For example, a solution of about 2% sodium hydroxide currently used for the positive-working photosensitive composition may be used as the second liquid.

TABLE 1

| Kind of liquids | Refractive index ($n_D$) |
| --- | --- |
| water | 1.34 |
| trichlorotrifluoroethane | 1.36 |
| carbon tetrachloride | 1.46 |
| benzene | 1.50 |
| chlorobenzene | 1.53 |

If a negative-working photosensitive composition is used, the most preferable liquid of those shown in Table 1 as the first liquid is water. Generally, most of the negative-working photosensitive compositions are soluble in organic solvents. If carbon tetrachloride, benzene, or chlorobenzene is used as the first liquid, the coated film often dissolves or swells. Although trichlorotrifluoroethane has no damaging effect on the coated film, it is not suited because the developer is miscible with it. The use of trichlorotrifluoroethane as the first liquid is allowed only in the following method. That is, after the exposure of the film is finished in liquid, the film is transferred into air. Thereafter, the film is developed by a developer which is placed in another vessel.

When a positive-working photosensitive composition is used, preferable liquids, as the first liquid, are trichlorotrifluoroethane, carbon tetrachloride, benzene and chlorobenzene, in Table 1. Generally, most of the positive-working photosensitive compositions are developers of water system such as afore-mentioned sodium hydroxide solution. Therefore, the use of water as the first liquid is not preferable. However, if exposure and development are done in different vessels, the use of water as the first liquid is still allowed.

The above-mentioned characteristics are only general tendencies. Practically, optimum first and second liquids should be selected for each photosensitive composition. For example, when a negative-working photosensitive composition of water-soluble type is used, it is of course not preferable to use water as the first liquid.

By using the above-mentioned method of this invention, patterns were formed in a room with a dust level of $10^4$ class. The resultant pattern quality was of the same order as would be obtained in a room with a dust level below 100. It was found, therefore, that no large investment was required for building a clean room. Further, any variation due to thermal expansion of the photomask could be avoided.

As described above, according to this invention, very economical fabrication of integrated circuits with high quality becomes possible. Therefore, the industrial effect of the invention is extremely large. Although in order to make the explanation of this invention clear, only exposure and developing steps of the substrate have been explained, it is needless to say that the invention may include other steps of integrated circuits associated with formation of various patterns that can be done in liquid, such as a step of etching the substrate in an etching solution.

Explanation of this invention will be made hereinafter by using an embodiment.

EMBODIMENT

A 2 in. square Si wafer was prepared as the substrate. On the wafer, a diluted solution of a positive-working photosensitive composition AZ-1350J (registered trademark, a product of Shipley Co., Ltd.) was spin-coated with a speed of 5000 rpm. The substrate was then prebaked in air for 20 min. at 80° C. As a result, a coated film with a thickness of 0.8 $\mu$m was formed.

Using an apparatus as shown in FIG. 1, trichlorotrifluoroethane ($CCl_2FCClF_2$) (refractive index $n_D^{20}=1.36$) is filled as the first liquid, while a mixed solution of a developer MF-312 (a product of Shipley Co., Ltd., water solution) for the above photosensitive composition and water with a ratio of 2:3 was filled as the second liquid. The both solutions were kept at a constant temperature of 25° C.

Figure 2:
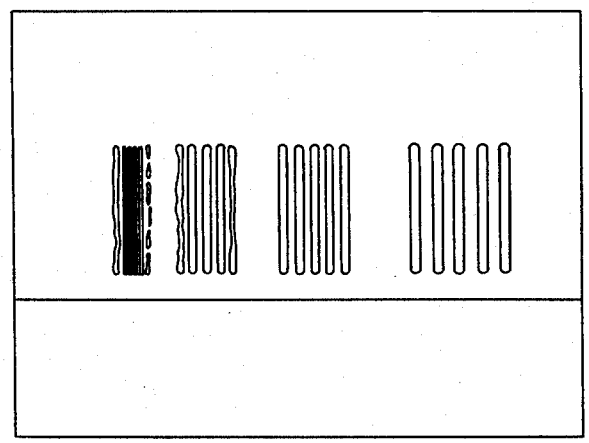
FIGS. 2 and 3 show patterns obtained by the method of this invention and a usual method for comparison, respectively.

A mask with patterns of 1.0 $\mu$m, 1.5 $\mu$m, 2.0 $\mu$m and 3.0 $\mu$m was pressure-mounted onto the wafer with a 20 $\mu$m spacer therebetween, and immersed into the first liquid. After it was confirmed that the first liquid was filled in the mask-wafer gap, ultraviolet light was irradiated on the coated film through the mask. After the irradiation, the mask and the spacer were demounted from the wafer. The wafer was transferred into the developer and developed therein for 60 sec. Thereafter, the wafer was washed by water and dried, as in the usual way. FIG. 2 shows a pattern thus obtained.

Figure 3:
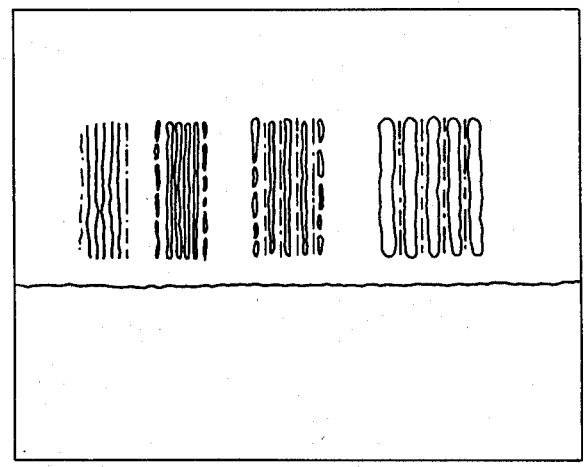

Next, for comparison, a wafer with the same coated film as above was prepared and subjected to the similar processes as above, except that exposure was done in air for the same period. FIG. 3 shows a pattern obtained. In FIGS. 2 and 3, patterns of 1.0 $\mu$m, 1.5 $\mu$m, 2.0 $\mu$m and 3.0 $\mu$m are shown from left.

In the case of exposure in air, the pattern of 1.5 $\mu$m was barely resolved as shown in FIG. 3 while in the case of a pattern formed by the method of this invention the mask part of 1.0 $\mu$m could be well resolved. Furthermore, in the case of irradiation in air, edges of the patterns were irregular due to diffraction of light, so that the shapes of patterns were deformed. On the other hand, in the case of irradiation in liquid, the edges of the patterns were linear. That is, the shapes of the patterns maintained those of the mask precisely.

We recognize, further, in the pattern of FIG. 3, the appearance of light and shade stripes, or the so called Newton rings, due to the interference of incident and reflected lights between the mask surface and the wafer surface. On the other hand, no such stripes are recognized in the pattern obtained by the method of this invention, the pattern of the mask being accurately reproduced.

Using the same mask, exposure was repeated sequentially in liquid. However, since the mask was kept at a constant temperature, all the obtained patterns had an accuracy of the same order.

We claim:

1. A pattern forming method comprising a step of disposing a substrate with a coated film of photoresist forming photosensitive composition and a mask having a predetermined pattern in a first liquid which does not dissolve said coated film of photoresist forming photosensitive composition; a step of exposing said coated film to light through said mask with said coated film and said mask being disposed in said first liquid; and a step of moving said substrate with said coated film after exposure into a second liquid that is in contact with said first liquid, is not miscible with the first liquid, and has a developing effect to said coated film of photosensitive composition, said substrate being moved into the second liquid to develop said film therein.

2. A pattern forming without method according to claim 1, wherein said first liquid is circulated through a filter to keep said liquid clean.

3. A pattern forming method according to claim 1, wherein said first liquid is kept at a constant temperature.

4. A pattern forming method according to claim 1, further comprising a step of disposing said second liquid in contact with said first liquid.

5. A pattern forming method according to claim 4, wherein said first liquid is circulated through a filter to make said first liquid clean.

6. A pattern forming method according to claim 4, wherein said first liquid is kept at a constant temperature.

7. A pattern forming method according to claim 1 or 4, wherein the specific gravity of said second liquid is smaller than that of said first liquid.

8. A pattern forming method according to claim 1 or 4, wherein the specific gravity of said second liquid is larger than that of said first liquid.

9. A pattern forming method according to claim 1 or 4, wherein said photoresist forming photosensitive composition is a negative working photoresist forming photosensitive composition.

10. A pattern forming method according to claim 9, wherein said first liquid is water.

11. A pattern forming method according to claim 1 or 4, wherein said photoresist forming photosensitive composition is a positive working photoresist forming photosensitive composition.

12. A pattern forming method according to claim 11, wherein said first liquid is selected from the group consisting of trichlorotrifluoroethane, carbon tetrachloride, benzene, and chlorobenzene.

13. A pattern forming method according to claim 1, wherein said substrate is a silicon wafer.

14. A pattern forming method according to claim 1, wherein said second liquid is a solvent for removing the coated film in either the exposed or unexposed regions of the coated film to develop said film.

* * * * *